(12) United States Patent  
Hattori et al.

(10) Patent No.: US 11,478,869 B2  
(45) Date of Patent: Oct. 25, 2022

(54) METHOD FOR FORMING BUMP ELECTRODE SUBSTRATE

(71) Applicant: SENJU METAL INDUSTRY CO., LTD., Tokyo (JP)

(72) Inventors: Takahiro Hattori, Tokyo (JP); Hiroki Sudo, Tokyo (JP); Hiroshi Okada, Tokyo (JP); Daisuke Souma, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 17/337,551

(22) Filed: Jun. 3, 2021

(65) Prior Publication Data

US 2021/0387276 A1 Dec. 16, 2021

(30) Foreign Application Priority Data

Jun. 10, 2020 (JP) .............................. JP2020-100616

(51) Int. Cl.
| | |
|---|---|
| *B23K 1/20* | (2006.01) |
| *H05K 3/34* | (2006.01) |
| *B23K 35/02* | (2006.01) |
| *B23K 101/42* | (2006.01) |

(52) U.S. Cl.  
CPC ............ *B23K 1/203* (2013.01); *B23K 35/025* (2013.01); *H05K 3/3478* (2013.01); *B23K 2101/42* (2018.08)

(58) Field of Classification Search  
None  
See application file for complete search history.

(56) References Cited

U.S. PATENT DOCUMENTS

| | | | | | |
|---|---|---|---|---|---|
| 4,752,027 | A | * | 6/1988 | Gschwend | ............... B23K 3/06 228/180.22 |
| 5,482,736 | A | * | 1/1996 | Glenn | .................... B23K 1/203 228/207 |

(Continued)

FOREIGN PATENT DOCUMENTS

| | | |
|---|---|---|
| JP | H08-139097 A | 5/1996 |
| JP | H09-260824 A | 10/1997 |

(Continued)

OTHER PUBLICATIONS

Decision to Grant a Patent issued by the Japan Patent Office for corresponding Japanese Patent Application No. 2020-100616, dated Jul. 31, 2020, with a full English translation.

(Continued)

*Primary Examiner* — Devang R Patel  
(74) *Attorney, Agent, or Firm* — Myers Wolin, LLC

(57) ABSTRACT

A method includes applying a first flux onto an electrode provided on a substrate and placing a solder material on the electrode, heating the substrate to form a solder bump on the electrode, deforming the solder bump to provide a flat surface or a depressed portion on the solder bump, applying a second flux to the solder bump; placing a core material on the solder bump, the core material including a core portion and a solder layer that covers a surface of the core portion, and heating the substrate to join the core material to the electrode by the solder bump and the solder layer.

10 Claims, 13 Drawing Sheets

(56) References Cited

U.S. PATENT DOCUMENTS

| | | | | |
|---|---|---|---|---|
| 5,788,143 | A * | 8/1998 | Boyd | H01L 21/4853 228/180.22 |
| 6,066,551 | A | 5/2000 | Satou et al. | |
| 6,087,597 | A | 7/2000 | Shimada et al. | |
| 6,204,558 | B1 | 3/2001 | Yanagida | |
| 6,543,674 | B2 * | 4/2003 | Lee | H01L 23/49816 228/180.22 |
| 6,796,025 | B2 * | 9/2004 | Imamura | H05K 3/3436 29/840 |
| 7,611,040 | B2 * | 11/2009 | Kitae | H01L 24/16 228/180.22 |
| 9,615,464 | B2 * | 4/2017 | Kubota | H05K 3/3463 |
| 9,662,730 | B2 * | 5/2017 | Hattori | H01L 21/4853 |
| 10,586,782 | B2 * | 3/2020 | Arvin | H01L 23/49894 |
| 2003/0201309 | A1 * | 10/2003 | Grigg | H01L 24/11 228/207 |
| 2010/0044416 | A1 * | 2/2010 | Ogawa | H01L 23/49816 228/164 |
| 2010/0276803 | A1 * | 11/2010 | Higuchi | H05K 3/3485 257/738 |
| 2011/0318878 | A1 * | 12/2011 | Tanaka | H01L 21/561 257/E21.509 |
| 2013/0133936 | A1 | 5/2013 | Yorita et al. | |
| 2015/0061129 | A1 | 3/2015 | Hattori et al. | |
| 2017/0221866 | A1 | 8/2017 | Cho | |
| 2017/0287859 | A1 * | 10/2017 | Harano | H01L 23/3171 |
| 2019/0295997 | A1 | 9/2019 | Cho | |
| 2019/0375054 | A1 | 12/2019 | Kawasaki et al. | |

FOREIGN PATENT DOCUMENTS

| | | |
|---|---|---|
| JP | 3886405 B2 | 2/2007 |
| JP | 2013-138169 A | 7/2013 |
| JP | 5692314 B2 | 4/2015 |
| JP | 2016-9740 A | 1/2016 |
| TW | 202000934 A | 1/2020 |
| WO | 97/18584 A1 | 5/1997 |

OTHER PUBLICATIONS

Notice of Submission of Opinions issued by the Korean Intellectual Property Office for corresponding Korean Patent Application No. 10-2021-0067350, dated Jun. 21, 2021, with an English machine translation.

The extended European search report with the European search opinion issued by the European Patent Office for corresponding European Patent Application No. 21177392.4-1202, dated Oct. 19, 2021.

Notification Letter of Review Opinions and Search Report issued by the Intellectual Property Bureau of the Ministry of Economic Affairs of Taiwan for corresponding Taiwan Patent Application No. 110118687, dated Oct. 26, 2021, with machine English translation.

Examination Report issued by the Patent Office of India for corresponding Indian Patent Application No. 202144023217, dated Sep. 16, 2021, with an English translation.

Technical Examination Report issued by the Brazilian Patent and Trademark Office for corresponding Brazilian Patent Application No. BR102021010133-4, dated Jan. 5, 2022, with an English translation.

Written Opinion issued by the Intellectual Property Office of Singapore for corresponding Singapore Patent Application No. 10202106036S, dated Jan. 24, 2022.

First Office Action issued by the State Intellectual Property Office of People's Republic of China for the corresponding Chinese patent application No. 202110631207.9 and dated Mar. 2, 2022.

Office Action issued by the Mexican Institute of Industrial Property for corresponding Mexican Patent Application No. MX/a/2021/006217, dated Mar. 29, 2022, with an English translation.

2nd Notification of Office Action issued by the China National Intellectual Property Administration for corresponding Chinese Patent Application No. 202110631207.9, dated Jul. 15, 2022, with an English translation.

* cited by examiner

EXAMPLE 3
BEFORE REFLOW

Φ0.22 mm Cu CORE BALL

Φ0.3 mm SOLDER BALL

AFTER REFLOW

VOID GENERATION RATE 0/30
EXAMPLE 1

VOID GENERATION RATE 0/30
EXAMPLE 2

VOID GENERATION RATE 0/30
EXAMPLE3

VOID GENERATION RATE 30/30
COMPARATIVE EXAMPLE 1

METHOD FOR FORMING BUMP ELECTRODE SUBSTRATE

CROSS-REFERENCE TO RELATED APPLICATION

This application claims priority under 35 U.S.C. § 119 to Japanese Patent Application No. 2020-100616, filed Jun. 10, 2020, the contents of which are incorporated herein by reference in their entirety.

TECHNICAL FIELD

The present disclosure relates to a method for forming a bump electrode substrate.

BACKGROUND

A Cu core ball is a ball-shaped core material including a core portion that is constituted by a Cu ball and others and a solder layer that coats a surface of the core portion. On the surface of the core portion, a Ni layer may be formed by coating Ni before coating the solder layer. In the present patent application, the Cu ball and others with the formed Ni layer are also referred to as the core portion. The Cu core ball serves as a spacer that keeps a distance between two substrates constant while joining the substrates. By using the Cu core ball, it is possible to restrain the crush between the substrates. Further, Cu included in the core portion has a higher electric conductivity than Sn. Therefore, when a current flows through the core portion, an electric conduction of an apparatus is improved and a good electromigration resistance is obtained.

JP5692314B describes that unlike solder balls, a thickness of an oxide film of the Cu core ball cannot be accurately managed based on only the degree of yellowness. JP5692314B also says that the thickness of the oxide film is managed so as to be equal to or smaller than a constant value before a melting of a solder.

SUMMARY

It is assumed that the Cu core ball is joined to an electrode in a state where the core portion is covered with the solder layer. However, the surface of the core portion may have a spot that is not covered with the solder layer. When two substrates, a CPU and a substrate, or a component and a substrate are joined in the state where the surface of the core portion is not covered with the solder layer, a problem called "non-wetting" arises. In the non-wetting, an intermetallic compound is formed on the surface of the Ni layer, for example, by a reaction between the Ni layer and the solder layer. Then, the intermetallic compound repels the solder and the solder is unable to adhere to the surface of the core portion.

Consider a case where substrates are laminated to join by using the Cu core ball, the non-wetting occurs on the Cu core ball at a first placement. In this case, as described above, the intermetallic compound formed on the surface of the Ni layer repels the solder. Therefore, even if a solder paste is applied at a second placement onto an electrode of a substrate on the side on which the Cu core ball is not joined, the non-wetting is not sometime resolved because the intermetallic compound repels the solder paste.

The non-wetting is due to insufficient amount of the solder. A possible improvement measure for resolving this problem is that the thickness of the solder layer covering the core portion is increased. However, the Cu core balls are mainly mass-produced by an electroplating method from viewpoints of eccentricity control of the core portion, achievement of high sphericity, and productivity. Therefore, there is a limit to the thickness of the solder layer that can be formed by the electroplating method. Further, there is also a problem in that the productivity of the Cu core balls decreases as the thickness of the solder layer increases.

Another possible improvement measure is that the solder paste is applied to an electrode before the Cu core ball is joined thereto. In this case, the non-wetting can be restrained. However, the solder paste causes a generation of a void and a variation in a height of a solder bump.

The present disclosure has been made to solve the problems described above, and has an object to provide a method for forming a bump electrode substrate that makes it possible to restrain the non-wetting while restraining the generation of the void and the variation in the height of the bump.

A method for forming a bump electrode substrate according to the present disclosure includes the steps of: applying a first flux onto an electrode provided on a substrate and placing a solder material on the electrode; heating the substrate to form a solder bump on the electrode; deforming the solder bump to provide a flat surface or a depressed portion on the solder bump; applying a second flux to the solder bump; placing a core material on the solder bump, the core material including a core portion and a solder layer that covers a surface of the core portion; and heating the substrate to join the core material to the electrode by the solder bump and the solder layer.

An anther method for forming a bump electrode substrate according to the present disclosure includes the steps of: applying a flux to a substrate on which an electrode and an insulating film are exposed, such that the flux covers at least the electrode; putting a core material and a solder material on the flux, the core material including a core portion and a solder layer that covers a surface of the core portion; and heating the substrate to join the core material to the electrode by the solder layer and the solder material.

Other characteristics of the present disclosure will be described later.

According to the present disclosure, it is possible to restrain the non-wetting while restraining the generation of the void and the variation in the height of the bump.

DESCRIPTION OF EMBODIMENTS

Figure 1A:
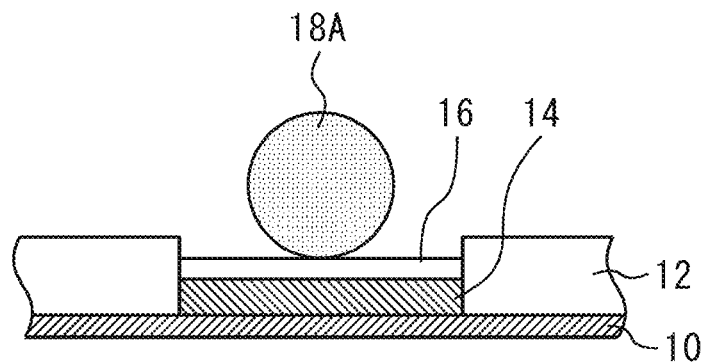
FIG. 1A and FIG. 1B are diagrams showing a method for forming a bump electrode substrate.

A method for forming a bump electrode substrate according to an embodiment will be described with reference to the drawings. Identical or corresponding constituent elements are denoted by identical reference characters, and repetitive descriptions are sometimes omitted.

EMBODIMENT

FIGS. 1 to 6 show an example of a method for forming a bump electrode substrate. FIG. 1 is a sectional view of the bump electrode substrate that shows the first step. An electrode 14 and an insulating film 12 are provided on a substrate 10. They can be provided as a printed board, for example. Then, a first flux 16 is applied onto the electrode 14 provided on the substrate 10, and a solder material is placed on the electrode 14. Examples of the first flux 16, which is not particularly limited, include a resin flux using a rosin resin or a synthetic resin such as an acrylic resin and a polyethylene resin, an aqueous flux using a polyalkylene glycol such as polyethylene glycol, terminal (alkyl) esterified polyalkylene glycol, terminal (alkyl) etherified polyalkylene glycol, terminal aminated polyalkylene glycol, terminal (alkyl) aminated polyalkylene glycol, terminal (alkyl) amidated polyalkylene glycol, or the like, and a thermoset flux using a thermoset resin such as an epoxy resin in which the reside component is a curing resin. Further the first flux 16 may be a non-washing flux using, as a base agent, a high-viscosity or solid solvent having volatility, while using no resin component or using a very small amount of resin component. Furthermore, as necessary, in addition to the resin component, the first flux 16 may contain an activator (organic acid, amine, halogenated organic compound, amine halogenated hydrobromide and the like), a thixotropic agent, a solvent, and other additive agents (an antioxidant, an antifoam agent and a colorant). Fluxes described later may have the same composition as the first flux 16.

Figure 1B:
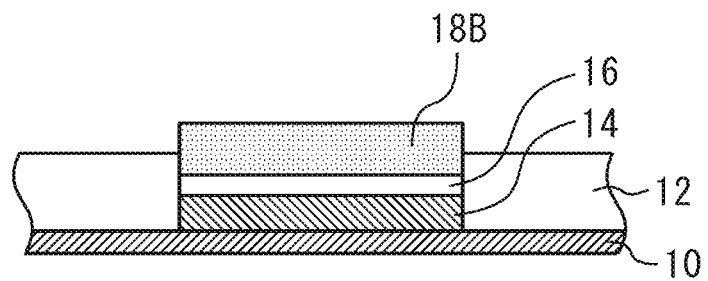

FIG. 1A shows a solder material 18A that is a solder ball. FIG. 1B shows a plate-shaped solder material 18B that is a preform solder. As the preform solder, for example, a structure in which the first flux 16 is applied to the solder material 18B can be employed. As an example, this structure can be placed on the electrode 14. Other than the shape of the solder material 18A in FIG. 1A and the shape of the solder material 18B in FIG. 1B, the shape of the solder material may be another shape such as a column shape and a ring shape. The composition of the solder materials 18A, 18B is not particularly limited, and the optimal composition can be selected on each occasion. For example, the composition containing Sn alone can be selected, the alloy composition of a lead-free solder alloy containing Sn as the main component can be selected, or the composition of a Sn—Pb solder alloy can be selected. In the case where the solder material 18A or the solder material 18B is composed of an alloy, examples of the lead-free solder composition include Sn, a Sn—Ag alloy, a Sn—Cu alloy, a Sn—Bi alloy, a Sn—Ag—Cu alloy, a Sn—In alloy, and alloys resulting from adding a predetermined alloy element to them. Examples of the alloy element to be added include Ag, Cu, In, Ni, Co, Sb, P, Fe, Bi, Ge, Ga, Zn, Mn, Pt and Pd.

Figure 2:
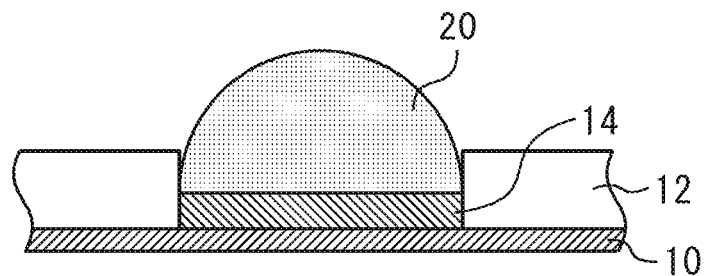
FIG. 2 is a diagram showing the method for forming the bump electrode substrate.

Next, the process proceeds to a step of heating the substrate. FIG. 2 is a sectional view showing the bump electrode substrate after the heating. In this step, the substrate 10 is heated, and a solder bump 20 is formed on the electrode 14. As an example, using a reflow apparatus, a preheating process of slowly increasing the temperature in the periphery of the substrate to about 240° C., a heating process of maintaining a temperature of about 240° C., and a cooling process of decreasing the temperature to room temperature are performed to the substrate. Another heating process of melting the solder material may be employed.

Figure 3A:
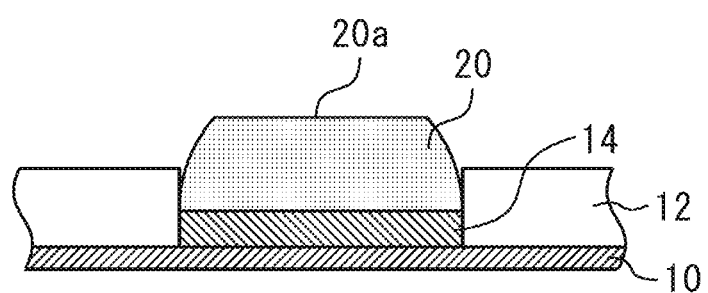
FIG. 3A and FIG. 3B are diagrams showing the method for forming the bump electrode substrate.

Next, the process proceeds to a step of deforming the solder bump. In this step, the solder bump 20 is deformed, and a flat surface or a depressed portion is provided on the solder bump 20. FIG. 3A shows the solder bump 20 on which a flat surface 20a is formed. For example, the flat surface 20a can be formed by a coining apparatus. The coining apparatus is an apparatus that flattens the solder bump by pressing a pressurizing block against the solder bump. For example, JP2012-104791A discloses such a coining apparatus.

Figure 3B:
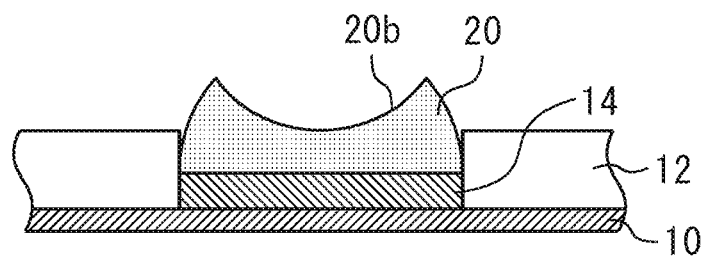

FIG. 3B shows the solder bump 20 on which a depressed portion 20b is formed. As an example, the depressed portion 20b is formed by providing a convex portion on the pressurizing block of the coining apparatus and pressing the convex portion against the solder bump 20. For example, the section shape of the depressed portion 20b can be a V-shape or a U-shape.

The solder bump 20 is joined to the electrode 14 by the above heating, and therefore, it is possible to stably perform the process of deforming the solder bump 20.

Figure 4:
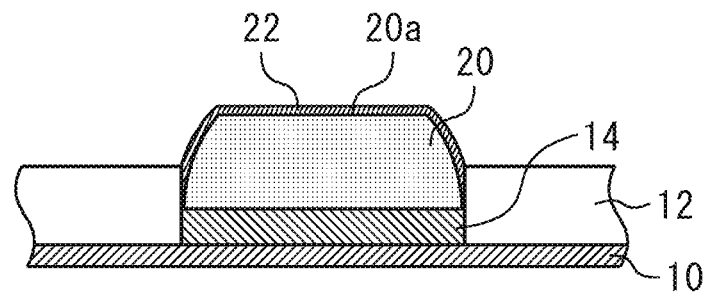
FIG. 4 is a diagram showing the method for forming the bump electrode substrate.

Next, a second flux is applied to the solder bump deformed as described above. FIG. 4 is a diagram showing that a second flux 22 has been applied to the solder bump 20. In the case where the solder bump 20 has the depressed portion 20b, the second flux is applied to the solder bump 20 shown in FIG. 3B. As the second flux, the same flux as the first flux may be used, or a different flux may be used.

Figure 5:
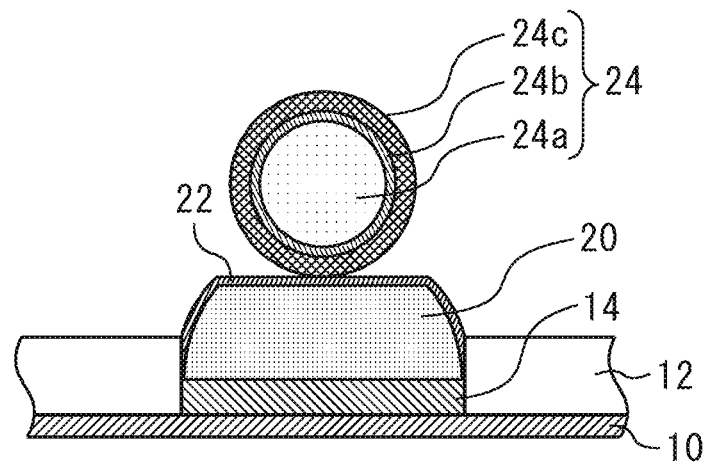
FIG. 5 is a diagram showing the method for forming the bump electrode substrate.

Next, a core material 24 is placed on the solder bump 20. FIG. 5 shows the core material 24 placed on the solder bump 20. In this example, the core material 24 includes a core portion 24a, a Ni layer 24b covering the core portion 24a, and a solder layer 24c covering the Ni layer 24b. As an example, the core portion 24a may be composed of Cu or a material containing Cu. As another example, a material having a higher melting point and higher electric conductivity than the solder layer 24c can be employed as the material of the core portion 24a. The Ni layer 24b and the solder layer 24c can be formed by plating.

A configuration example of the core portion 24a will be described below.

Composition of Core Portion 24a

As an example, the core portion 24a may be composed of Cu alone, or may be composed of an alloy containing Cu as the main component. In the case where the core portion 24a is composed of an alloy, the content of Cu is 50 mass % or more. Further, the ball as the core may be composed of a metal such as Ni, Ag, Bi, Pb, Al, Sn, Fe, Zn, In, Ge, Sb, Co, Mn, Au, Si, Pt, Cr, La, Mo, Nb, Pd, Ti, Zr and Mg, other than Cu, may be composed of an alloy, a metal oxide or a mixed metal oxide, or may be composed of a resin material.

Sphericity of Core Portion 24a: 0.95 or Higher

The sphericity of the core portion 24a preferably should be 0.95 or higher, from a standpoint of the control of the standoff height, but is not particularly limited. More preferably, the sphericity should be 0.990 or higher. In the present disclosure, the sphericity indicates the deviation from the perfect spherical body. The sphericity can be evaluated by various methods such as a least square center method (LSC method), a minimal zone center method (MZC method), a maximal inscribed center method (MIC method) and a minimal circumscribed center method (MCC method). In more detail, the sphericity is the arithmetic mean value of values calculated by dividing the diameters of 500 core portions 24a by the long diameters, and the core portion 24a is closer to the perfect spherical body as the sphericity is closer to 1.00, which is the upper limit of the sphericity. In the present disclosure, the length of the long diameter and the length of the diameter are measured by ULTRA QUICK VISION, ULTRA QV350-PRO, which is a measurement apparatus manufactured by Mitutoyo Corporation.

Diameter of Core Portion 24a: 1 to 1000 μm

The diameter of the core portion 24a in the present disclosure is not particularly limited, and preferably should be 1 to 1000 μm. In this range, it is possible to stably produce the spherical core portion 24a, and to restrain the connection short circuit when the pitch between the terminals is narrow.

As an example, the core portion 24a in FIG. 5 has a ball shape. However, the shape of the core portion 24a is not particularly limited. For example, the shape of the core portion may be a circular column shape or a rectangular column shape. When the core portion has a circular column shape or a rectangular column shape, the core material also has a circular column shape or a rectangular column shape. In the case of the core portion having a circular column shape or a rectangular column shape, the core portion is provided such that the bottom surface faces the electrode 14.

A configuration example of the solder layer 24c will be described below.

Composition of Solder Layer 24c

The solder composition of the solder layer 24c is not particularly limited, and the optimal composition can be selected on each occasion. For example, the composition containing Sn alone can be selected, the alloy composition of a lead-free solder alloy containing Sn as the main component can be selected, or the composition of a Sn—Pb solder alloy can be selected. In the case where the solder layer 24c is composed of an alloy, examples of the lead-free solder composition include Sn, a Sn—Ag alloy, a Sn—Cu alloy, a Sn—Bi alloy, a Sn—Ag—Cu alloy, a Sn—In alloy, and alloys resulting from adding a predetermined alloy element to them. Examples of the alloy element to be added include Ag, Cu, In, Ni, Co, Sb, P, Fe, Bi, Ge, Ga, Zn, Mn, Pt and Pd. The thickness of the solder layer 24c is not particularly limited, and only needs to be 100 μm (one side) or less, for example. Generally, the thickness of the solder layer 24c may be 5 to 50 μm.

An exemplary method for producing the core material 24 will be described below.

For the core portion 24a constituting the core material 24, a Cu material as the material of the core portion 24a is placed on a heat-resistant plate that is a plate composed of a material such as a ceramic and having heat resistance, and is heated in a furnace together with the heat-resistant plate. On the heat-resistant plate, many round grooves whose bottom portions have a hemispherical shape are provided. The diameter and depth of the groove are appropriately set depending on the particle diameter of the core portion 24a. Further, tip-shaped Cu materials (referred to as "tip materials" hereinafter) are obtained by cutting a Cu thin wire, and one tip material is put in each groove on the heat-resistant plate.

The heat-resistant plate having the tip materials in the grooves is put in a furnace filled with a reducing gas, for example, an ammonia decomposition gas, the temperature is raised to 1100° C. to 1300° C., and the heating process is performed for 30 minutes to 60 minutes. At this time, when the temperature in the furnace becomes equal to or higher than the melting point of Cu, the tip material melts and becomes a spherical shape. Thereafter, the interior of the furnace is cooled, and the core portion 24a is formed in the grooves on the heat-resistant plate. After the cooling, for the formed core portion 24a, the heating process may be performed again, at 800° C. to 1000° C., which are temperatures lower than the melting point of Cu.

As other methods, there are an atomizing method of dropping molten Cu from an orifice provided at a bottom portion of a crucible, cooling the droplet and forming the core portion 24a in a spherical shape, and a method of heating a Cu cut metal to 1000° C. or higher by thermal plasma and forming a spherical shape.

As the Cu material that is the raw material of the core portion 24a, for example, a pellet, a wire, a pillar and the like can be used.

As methods for forming the solder layer 24c on the core portion 24a by moving the core portion 24a made as described above and a plating solution, there are a known electrolytic plating method such as barrel plating, a method of generating the high-speed turbulent flow of the plating solution in a plating tank using a pump connected with the plating tank and forming the solder layer 24c on the core portion 24a using the turbulent flow of the plating solution, and a method of providing a vibration plate in the plating tank, stirring the plating solution with the high-speed turbulent flow by vibrating the vibration plate at a predetermined frequency, and forming the solder layer 24c on the core portion 24a using the turbulent flow of the plating solution, for example.

After the plating processing, drying is performed in the air or an N2 atmosphere, so that the core material 24 according to the present disclosure can be obtained.

Figure 6:
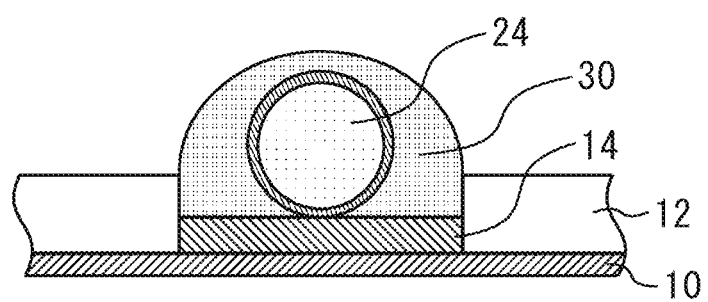
FIG. 6 is a diagram showing the method for forming the bump electrode substrate.

Next, the substrate on which the core material 24 is placed is heated. FIG. 6 is a sectional view of the bump electrode substrate after the heating. The substrate is heated by means such as reflow, and the solder bump 20 and the solder layer 24c are molten. Thereby, the solder bump 20 and the solder layer 24c become a solder 30, and the core material 24 can be joined to the electrode 14 by the solder 30.

An example of the heating of the substrate will be described. The present disclosure is not limited to the following description.

The substrate 10 is heated, the temperature of the substrate 10 is raised from ordinary temperature to about the liquidus temperature of the solder, and an oxide film on the surface that contacts with the core material 24 and the second flux 22 of the solder bump 20 is removed (first melting step). In the first melting step, an oxide film on the solder bump 20 and only an oxide film on the bottom surface side of the core material 24 that contacts with the second flux 22 are removed by the second flux 22.

Next, following the oxide film removal step, the temperature of the substrate 10 is further raised to the melting temperature of the solder layer 24c (second melting step). At this time, the solder layer 24c melts and moves to the solder bump 20, and a self-alignment phenomenon of the core material 24 and a phenomenon of sinking of the core portion 24a to the electrode 14 occur (FIG. 6). The self-alignment phenomenon is a phenomenon in which the core material 24 moves to the center of the electrode 14 in a self-alignment manner.

At this time, the surface of the core material 24 is still covered with the oxide film, and the solder layer 24c starts to melt from the electrode 14 side having a small heat capacity, toward the top of the core portion 24a. Just before the start of the melting, the solder layer 24c at a bottom shell of the core portion 24a melts and starts to spread from the contact site (outer portion). As a result, the core portion 24a sinks to the electrode 14. In this state, the solder layer 24c at the shell of the surface of the core portion 24a melts, and the interior covered with the oxide film sequentially transitions to the solder layer 24c, so that the core portion 24a is freed from the restraint of the solder layer 24c.

Next, the second flux 22 rises upward while removing the oxide film on the surface of the solder layer 24c. In this example, at the time of the change to the melting temperature of the solder layer 24c, the substrate 10 is heated such that the second flux 22 slowly rises from the solder bump 20 to the core portion 24a (oxide film removal step).

Then, the substrate 10 is slowly heated such that the solder layer 24c slowly flows down from the core portion 24a to the electrode 14. When the oxide film on the whole of the solder layer 24c is removed in the second melting step, the solder layer 24c flows down from the outside of the core portion 24a to the electrode 14.

With the method for forming the bump electrode substrate according to the embodiment, when the core material 24 is joined to the electrode 14, not only the solder layer 24c but also the solder bump 20 can be used, and therefore, the core portion 24a can be fixed to the electrode 14 by a sufficient amount of solder. Accordingly, as shown in FIG. 6, it is possible to restrain the non-wetting in which a part of the core portion is not covered with the solder. Moreover, it is not necessary to increase the thickness of the solder layer 24c of the core material 24, and therefore, it is possible to avoid the increase in cost due to the formation of a thick solder layer by plating. In the above-described example, a "solder paste" is not used, and therefore, the generation of a void described later is restrained. The "solder paste" is a creamy solder in which fine solder powders and a flux are mixed.

Figure 7A:
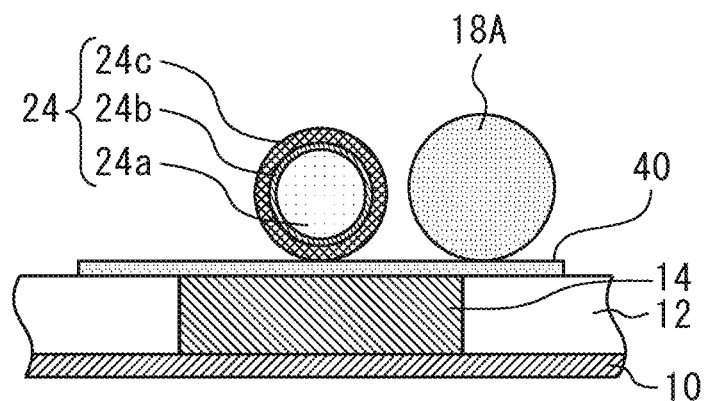
FIG. 7A and FIG. 7B are diagrams showing a method for forming a bump electrode substrate according to another example.
Figure 7B:
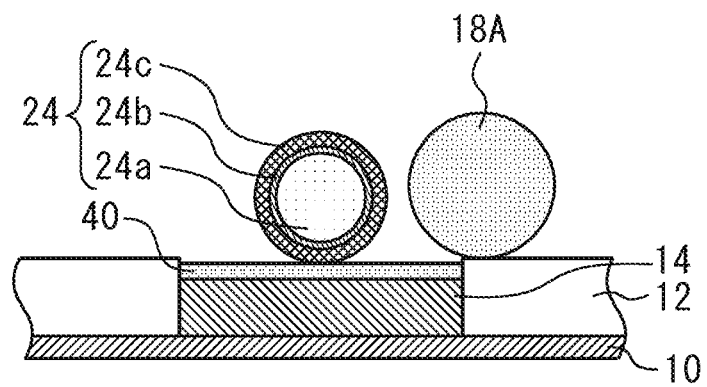
Figure 8:
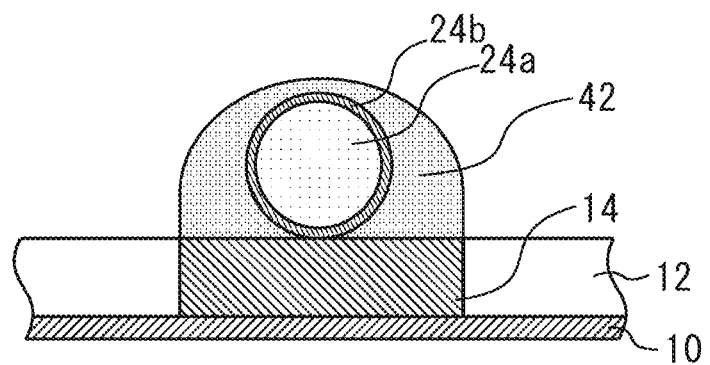
FIG. 8 is a diagram showing the method for forming the bump electrode substrate according to the another example.

FIG. 7 and FIG. 8 are diagrams showing a method for forming a bump electrode substrate according to another example. Differences from the method for forming the bump electrode substrate described with reference to FIGS. 1 to 6 will be mainly described. In the method for forming the bump electrode substrate, first, a flux is applied to a substrate on which an electrode and an insulating film are exposed. FIG. 7A and FIG. 7B show that a flux 40 has been applied to a substrate on which the electrode 14 and the insulating film 12 are exposed. The flux 40 covers at least the electrode 14. As an example, as shown in FIG. 7A, the flux 40 is applied to the electrode 14 and the insulating film 12 at the periphery of the electrode 14. As another example, as shown in FIG. 7B, the electrode 14 is provided such that the upper surface of the electrode 14 is lower than the upper surface of the insulating film 12, and the flux is applied to the upper surface of the electrode 14.

Next, the core material 24 and the solder material 18A are put on the flux 40. The core portion 24a of the core material 24 can be formed in various shapes as described above. The solder material 18A can also be formed in various shapes as described above. As an example, the core material 24 including the core portion 24a that is composed of Cu or a material containing Cu and the solder layer 24c that covers the surface of the core portion 24a, and the solder material 18A are put on the flux 40.

As an example, when the core material 24 and the solder material 18A are put on the flux 40, one of the core material 24 and the solder material 18A can be put on the electrode 14, and the other can be put on the insulating film 12. Specifically, the core material 24 may be put on the electrode 14, and the solder material 18A may be put on the insulating film 12. Alternatively, the solder material 18A may be put on the electrode 14, and the core material 24 may be put on the insulating film 12.

As another example, both of the core material 24 and the solder material 18A may be put on the electrode 14. In this case, the area of the electrode 14 is large to some extent.

As an example, the flux 40 can temporarily fix the core material 24 and the solder material 18A. For example, a flux having some viscosity can temporarily fix the core material 24 and the solder material 18A. For example, an aqueous flux having viscosity can temporarily fix the core material 24 and the solder material 18A.

Figure 9:
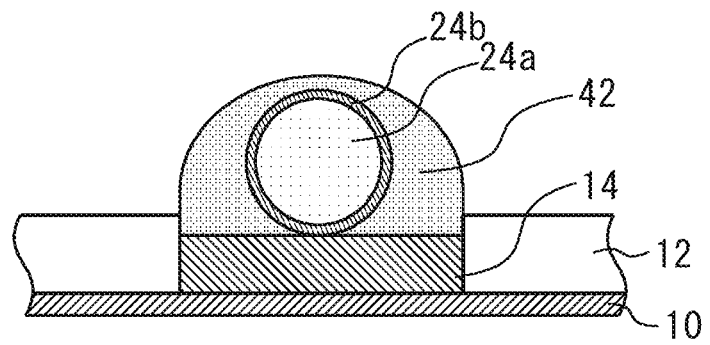
FIG. 9 is a diagram showing the method for forming the bump electrode substrate according to the another example.

Next, the substrate is heated. FIG. 8 is a sectional view of the bump electrode substrate after the substrate in FIG. 7A is heated. FIG. 9 is a sectional view of the bump electrode substrate after the substrate in FIG. 7B is heated. When the substrate is heated, the solder layer 24c and the solder material 18A melt and become a solder 42 that joins the core material 24 to the electrode 14. Thus, it is possible to provide the bump electrode substrate in which the non-wetting is restrained.

In the example described with reference to FIGS. 7 to 9, at least one core material and at least one solder material are provided for one electrode, and the core material can be joined to the electrode simply by heating the substrate. Therefore, the example is suitable for step simplification. However, the density of the electrode pattern needs to be low to some extent, because the core material and solder material provided for a certain electrode can influence the core material and solder material provided for another electrode.

Next, first to third examples and first and second comparative examples will be described. Table 1 describes the bump formation method, the specification of the Cu core ball, the solder composition, the ball diameter, the existence of the non-wetting, the existent of the void, and the variation in bump height, for each of the first, second and third examples and the first and second comparative examples.

TABLE 1

| | Bump formation method | Specification of Cu core ball | Solder composition | Ball diameter | Existence of non-wetting | Existence of void in joint | Variation in bump height |
|---|---|---|---|---|---|---|---|
| Ex. 1 | (1) Bump formation by solder ball (2) Coining (3) Joining of Cu core ball | Diameter: 0.22 mm Solder layer thickness: one side 18 μm | Sn-3 mass % Ag-0.5 mass % Cu | 0.3 mm | ○ | ○ | ○ |
| Ex. 2 | The same as first example | Solder composition: Sn-3 mass % Ag-0.5 mass % Cu | Sn-3 mass % Ag-0.5 mass % Cu | 0.17 mm | ○ | ○ | ○ |
| Ex. 3 | One solder ball and one Cu core ball are placed (adjacently), and joined and unified by flux | Intermediate layer thickness: one side 2 μm Intermediate layer material: | Sn-3 mass % Ag-0.5 mass % Cu | 0.3 mm | ○ | ○ | ○ |
| CEx. 1 | Bump formation by Cu core ball and paste | Ni Core diameter: 0.18 mm | Sn-3 mass % Ag-0.5 mass % Cu | — | ○ | X | X |
| CEx. 2 | Joining of only Cu core ball | | — | — | X | ○ | ○ |

Figure 10:
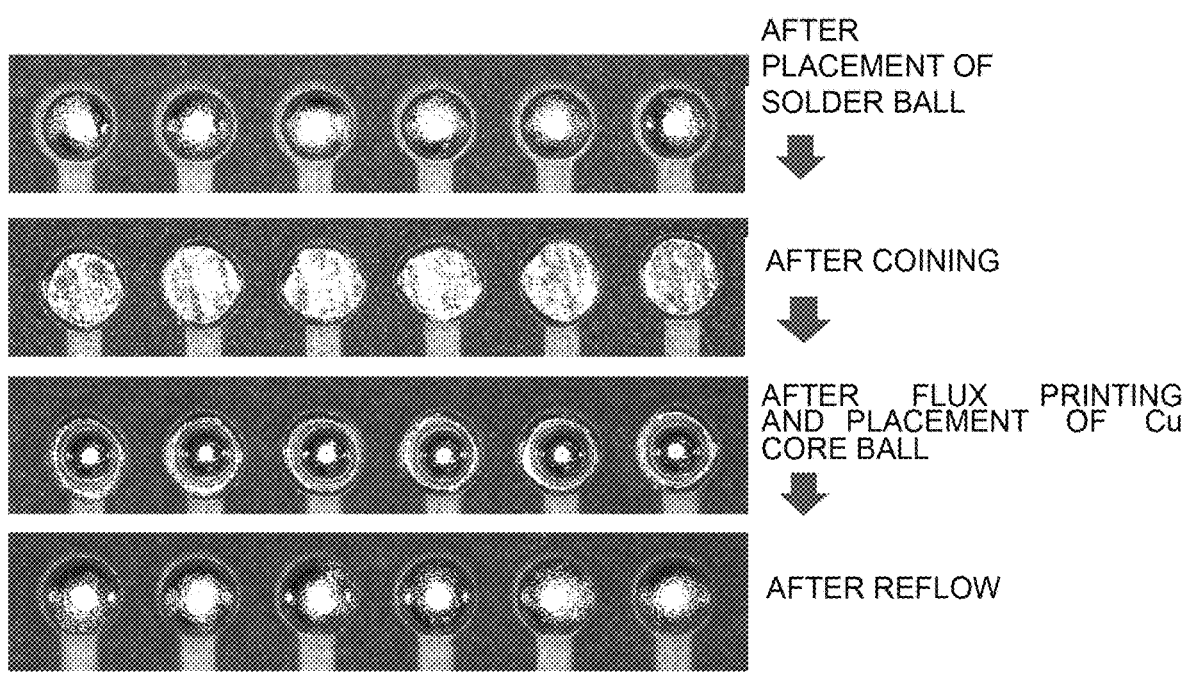
FIG. 10 is a diagram showing an external appearance at each stage in a first example.

The bump electrode substrate in the first example was made by the following method. A flux (WF-6317 manufactured by Senju Metal Industry Co., Ltd.) was applied onto the electrode of the substrate, the solder ball was placed on the electrode, and the solder was joined to the electrode by reflow processing, so that a solder bump electrode was formed. As for the used substrate, the Cu—OSP process of electrode pads was performed, the diameter of the opening of each electrode pad was 0.24 mm, and the pitch between the electrodes was 0.5 mm. For the reflow processing method, a triangle profile with a peak of 245° C. was set. Thereafter, the substrate and the bump were sandwiched and pressurized by a vise, and thereby, the solder bump was flattened. Then, the Cu core ball was put on the flattened solder bump, and the reflow was performed. FIG. 10 is a diagram showing an external appearance at each stage of the formation of the bump electrode substrate in the first example. The solder after the coining had a flat surface with almost the same area as the area of an electrode having a nearly circular shape, but the area of the flat surface is not particularly to this.

Figure 11:
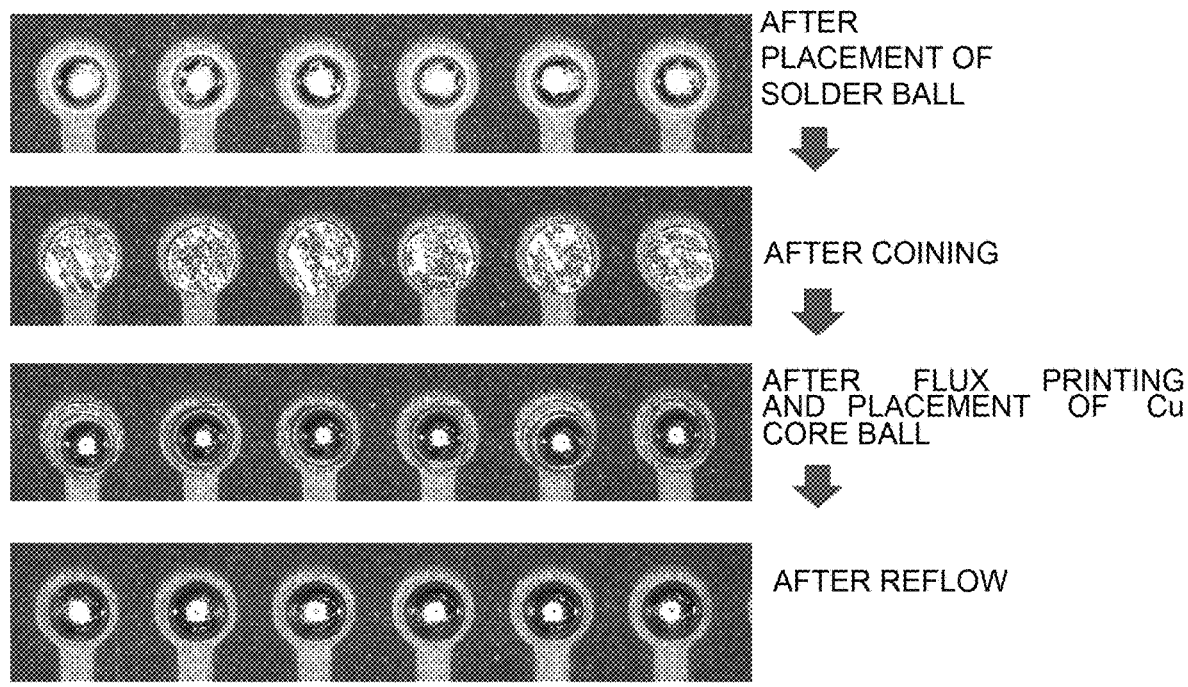
FIG. 11 is a diagram showing an external appearance at each stage in a second example.

The bump electrode substrate in the second example was formed by the same method as the first example. The diameter of the solder ball used in the first example was 0.3 mm, and the diameter of the solder ball used in the second example was 0.17 mm. Accordingly, the second example is different from the first example in that a smaller solder ball than that in the first example was used. FIG. 11 is a diagram showing an external appearance at each stage in the formation of the bump electrode substrate in the second example.

Figure 12:
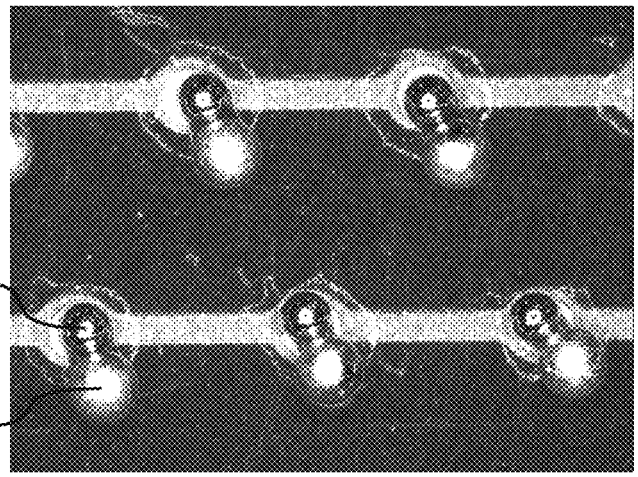
FIG. 12 is a diagram showing external appearances before and after reflow in a third example.
Figure 12:
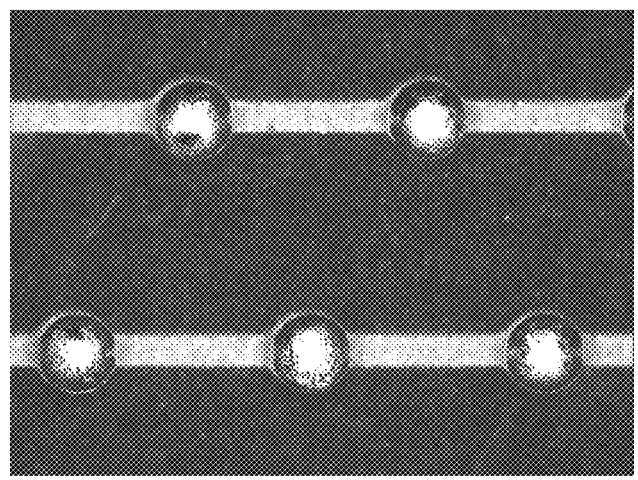

The bump electrode substrate in the third example was obtained by putting the solder ball and the Cu core ball on the electrode on which the flux was applied and performing the reflow process. The substrate was the same as that in the first example, except that the pitch between the electrodes was 1 mm. The condition of the reflow process was the same as the condition in the first example. FIG. 12 is a diagram showing external appearances before and after the reflow in the third example. From the external appearance before the reflow, it is found that the flux was applied onto the electrode and the insulating film at the periphery of the electrode. The Cu core ball is on the electrode, and at least a part of the solder ball is on the insulating film. When the reflow process is performed in this state, the molten solder ball wets the electrode so as to be pulled to the electrode, so that the solder ball and the Cu core ball are mounted on the electrode.

Figure 13:
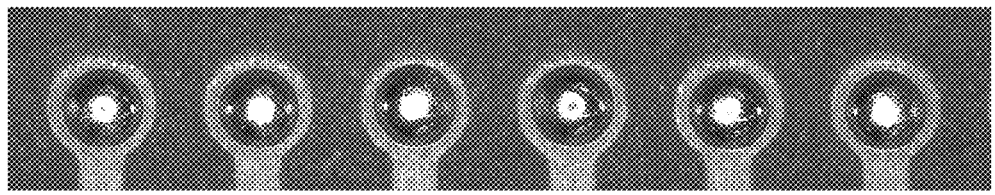
FIG. 13 is a diagram showing an external appearance of a bump electrode substrate in a first comparative example.

The bump electrode substrate in the first comparative example was obtained by providing a solder paste on the electrode, putting the Cu core ball on the solder paste and performing the reflow process. The solder paste is a creamy solder in which fine solder powders and a flux are mixed. In the solder paste used in the first comparative example, the solder composition was Sn-3 mass % Ag-0.5 mass % Cu. As for the specification of a mask used for the printing of the solder paste in the first comparative example, the opening diameter of the solder mask was φ0.24 mm, and the thickness was 0.01 mm. FIG. 13 is a diagram showing an external appearance of the bump electrode substrate in the first comparative example.

The bump electrode substrate in the second comparative example was obtained by putting the Cu core ball on the electrode to which the same flux as the flux in the first example was applied, and performing the reflow process. In the second comparative example, the Cu core ball was joined to the electrode by only the solder layer on the surface of the Cu core ball.

Details of the test methods for the non-wetting, the void and the variation in bump height are shown as follows. For one sample, 30 solder bump electrodes having the same condition were made, and were evaluated as shown below.

(1) Existence of Non-Wetting

After the molding with an epoxy resin, cross-sectioning was performed by a polishing apparatus "TegraPol 25" manufactured by Struers, and the evaluation was performed by visual observation, using FE-EPMA (field emission type electron probe microanalyzer, JXA-8530F manufactured by JEOL), based on the following reference.

The number of non-wetting spots is 0: ○
The number of non-wetting spots is 1 or more: x (2) Existence of Void in Joint The evaluation was performed by visual observation, using a transmission X-ray photograph (apparatus: XD7600NT manufactured by Nordson Dage), based on the following reference.

The number of voids is 0: ○
The number of voids is 1 or more: x (3) Variation in Bump Height The evaluation was performed using a real color confocal microscope (apparatus: OPTELICS C130 manufactured by LaserTec), based on the following reference.

The variation in bump height is 3 μm or less: ○
The variation in bump height is more than 3 μm: x For the above-described "(1) Existence of Non-wetting", after the sample after the formation of the bump was buried in the epoxy resin, the cross-sectioning was performed, and then the evaluation was performed. For the above-described "(2) Existence of Void in Joint" and "(3) Variation in Bump height", the evaluation was performed using the sample after the formation of the bump.

Figure 14:
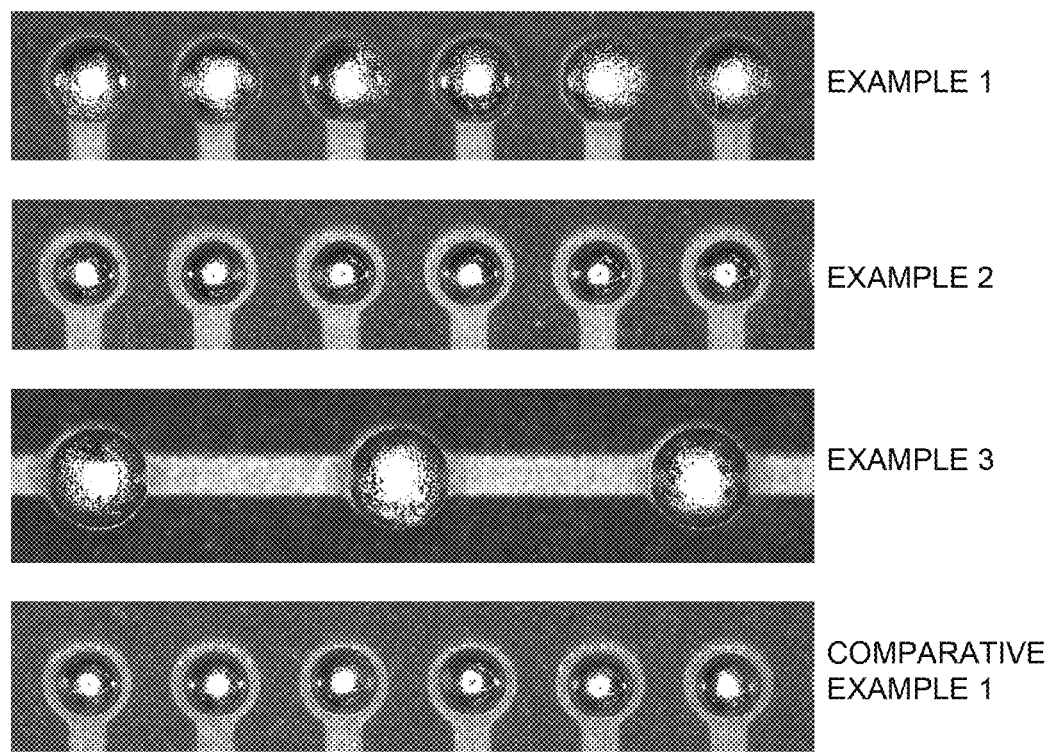
FIG. 14 is a diagram showing external appearances of bump electrode substrates in the first to third examples and the first comparative example.

FIG. 14 is a diagram showing external appearances of the bump electrode substrates after the reflow according to the first to third examples and the first comparative example. The volume of the solder ball in the first example was larger than the volume of the solder ball in the second example, and was larger than the volume of the solder paste in the first comparative example. The volume of the solder ball in the second example was equal to the volume of the solder paste in the first comparative example. By deforming the solder material by means such as coining, it is possible to increase the supply amount of the solder, compared to the case where the solder paste is provided by printing.

Figure 15:
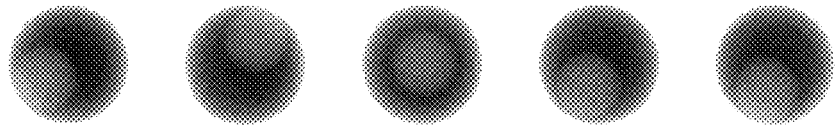
FIG. 15 is a diagram showing transmission X-ray observation results for bump electrodes.
Figure 15:
Figure 15:
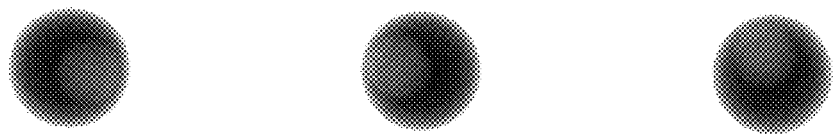
Figure 15:
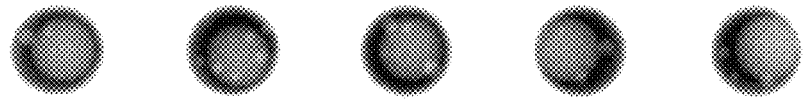

FIG. 15 is a diagram showing transmission X-ray observation results for bump electrodes in the first to third examples and the first comparative example. In the first to third examples, in the observation of the 30 bump electrodes, the void was not found. On the other hand, in the first comparative example, in the observation of the 30 bump electrodes, the void was found in all bump electrode. This result reveals that the use of the solder paste causes the void.

Figure 16:
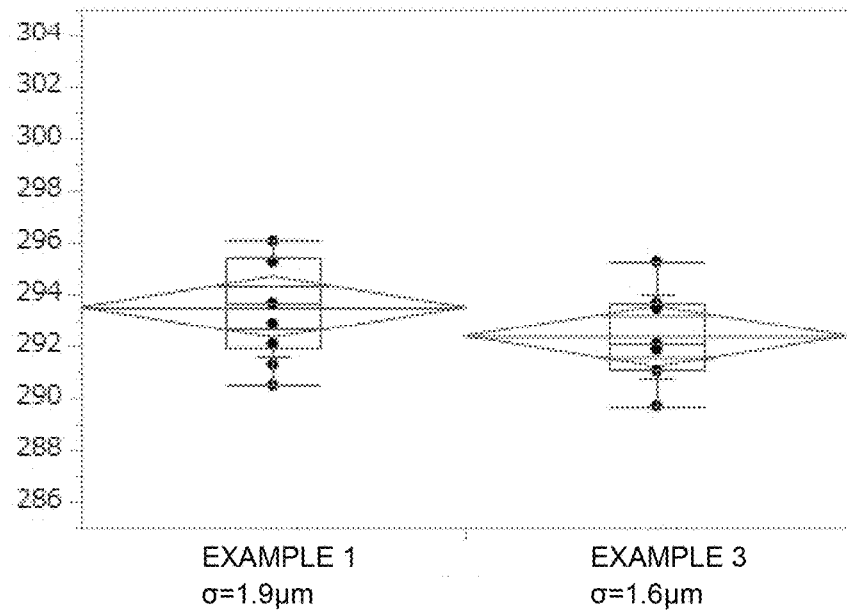
FIG. 16 is a diagram showing the variation in bump height.
Figure 17:
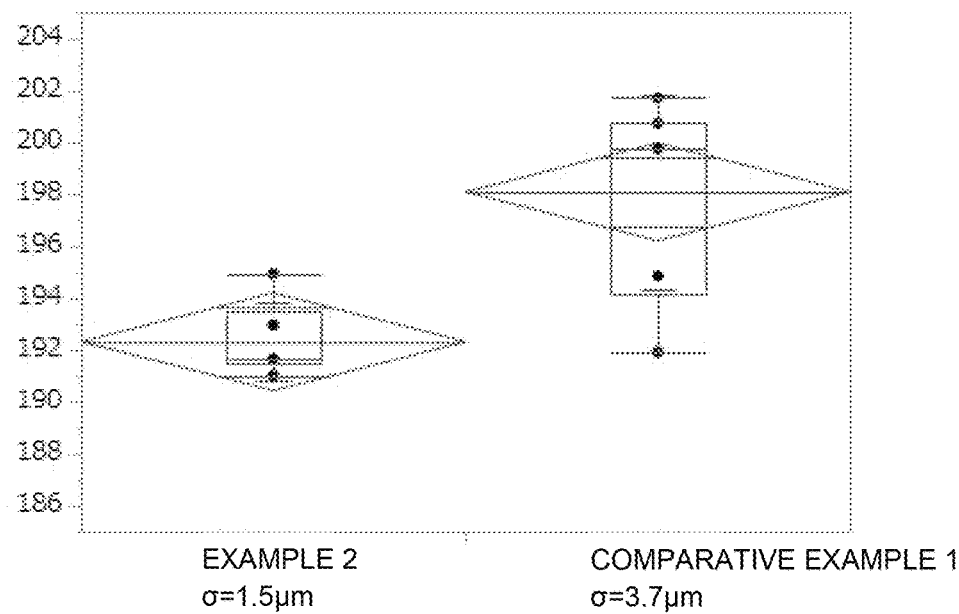
FIG. 17 is a diagram showing the variation in bump height.

FIG. 16 and FIG. 17 are diagrams showing the variation in bump height for each of the first to third examples and the first comparative example. The bump heights of a plurality of bump electrodes having an identical condition were measured by the confocal microscope, and the variation was calculated. FIG. 16 shows the bump heights of a plurality of bump electrodes in the first example and the bump heights of a plurality of bump electrodes in the third example. The standard deviation σ of the bump height in the first example was 1.9 μm, and the standard deviation σ of the bump height in the third example was 1.6 μm. It was confirmed that the variation was small in both of the first example and the third example.

FIG. 17 shows the bump heights of a plurality of bump electrodes in the second example and the bump heights of a plurality of bump electrodes in the first comparative example. The standard deviation σ of the bump height in the second example was 1.5 μm, and the standard deviation σ of the bump height in the first comparative example was 3.7 μm. This result reveals that the second example can decrease the variation in bump height and the first comparative example increases the variation in bump height.

Figure 18:
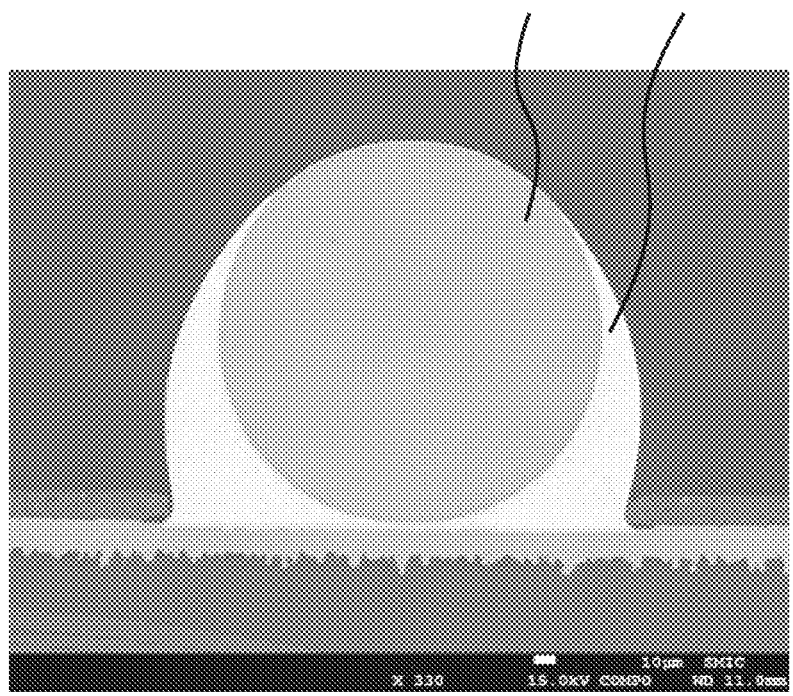
FIG. 18 is a sectional SEM photograph of a bump electrode substrate in a second comparative example.

In the second comparative example, as shown in Table 1, the non-wetting in which a part of the core portion is not covered with the solder occurred in all samples. FIG. 18 is a sectional SEM photograph of the bump electrode substrate formed by the method in the second comparative example. The SEM photograph shows that a part of the core portion 24a is not covered with the solder layer 24c.

Figure 19:
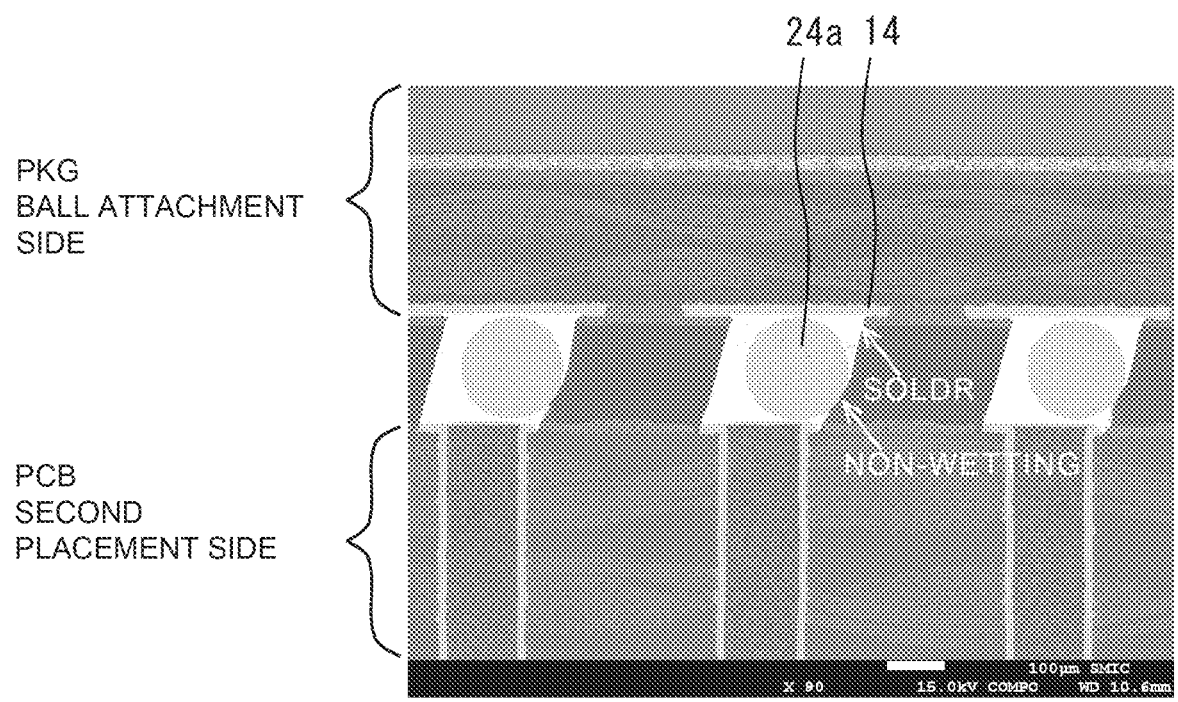
FIG. 19 is a sectional SEM photograph obtained after the second placement of the bump electrode substrate in a second comparative example.

The joining of the Cu core ball to the electrode on the substrate is referred to as a first placement, and the joining of the Cu core ball to a PCB (printed circuit board) after the first placement is referred to as a second placement. When the non-wetting occurs in the first placement as in the case of the second comparative example, the non-wetting sometimes occurs also in the second placement. FIG. 19 is a sectional SEM photograph obtained after the second placement of the bump electrode substrate in the second comparative example on the PCB in which the paste was applied to the electrode. As is clear from FIG. 19, the non-wetting occurred at the core portion 24a in the second comparative example after the second placement.

What is claimed is:

1. A method for forming a bump electrode substrate, the method comprising:
   applying a first flux to an electrode provided on a substrate and placing a solder material on the electrode;
   heating the substrate to a temperature at which the solder material melts to form a solder bump on the electrode;
   deforming the solder bump to provide a flat surface or a depressed portion on the solder bump;
   applying a second flux to the flat surface or the depressed portion on the solder bump;
   placing a core material on the second flux, the core material including a core portion and a solder layer that covers a surface of the core portion; and
   heating the substrate to melt both the solder bump and the solder layer to be a solder to join the electrode to the core material of which the surface of the core portion is covered with the solder.

2. The method according to claim 1, wherein the solder material is a solder ball.

3. The method according to claim 1, wherein the solder material is a preform solder.

4. The method according to claim 3, wherein in the placing the solder material, a structure in which the first flux is applied to the solder material is placed on the electrode.

5. The method according to claim 1, wherein the flat surface is formed by a coining apparatus.

6. The method according to claim 1, wherein the core material is a Cu core ball.

7. The method according to claim 1, wherein the core material has a circular column shape or a rectangular column shape.

8. A method for forming a bump electrode substrate, the method comprising:
   applying a flux to a substrate on which an electrode and an insulating film are exposed, such that the flux covers at least the electrode;
   putting a core material and a solder material on the flux, the core material including a core portion and a solder layer that covers a surface of the core portion, wherein one of the core material and the solder material is on the electrode, and the other is on the insulating film; and
   heating the substrate to a temperature at which the solder material and the solder layer melt to join the core material to the electrode by the solder layer and the solder material.

9. The method according to claim 8,
   wherein the flux is applied to the insulating film.

10. The method according to claim 8, wherein the flux is an aqueous flux, and the aqueous flux temporarily fixes the core material and the solder material.

\* \* \* \* \*